(12) United States Patent
Gambino et al.

(10) Patent No.: US 7,208,193 B2
(45) Date of Patent: Apr. 24, 2007

(54) DIRECT WRITING OF METALLIC CONDUCTOR PATTERNS ON INSULATING SURFACES

(75) Inventors: Richard Gambino, Stony Brook, NY (US); Robert Greenlaw, Huntington Beach, CA (US); Shaun Kubik, Rocky Point, NY (US); Jon Longtin, Port Jefferson, NY (US); Joshua Margolies, Niskayuna, NY (US); Sanjay Sampath, Setauket, NY (US)

(73) Assignee: Research Foundation of the State University of New York, Stony Brook, NY (US)

( * ) Notice: Subject to any disclaimer, the term of this patent is extended or adjusted under 35 U.S.C. 154(b) by 0 days.

(21) Appl. No.: 10/504,343

(22) PCT Filed: Sep. 26, 2003

(86) PCT No.: PCT/US03/30425

§ 371 (c)(1),
(2), (4) Date: Oct. 31, 2005

(87) PCT Pub. No.: WO2004/060579

PCT Pub. Date: Jul. 22, 2004

(65) Prior Publication Data

US 2006/0068087 A1    Mar. 30, 2006

(51) Int. Cl.
*B05D 1/02* (2006.01)
*B05D 5/12* (2006.01)

(52) U.S. Cl. .................... 427/98.4; 427/191; 427/199; 427/427.1

(58) Field of Classification Search ............... 427/98.4, 427/191, 199, 427.1
See application file for complete search history.

(56) References Cited

U.S. PATENT DOCUMENTS

| 6,291,012 | B1 * | 9/2001 | Miyasaka | 427/191 |
| 6,673,386 | B2 * | 1/2004 | Komyoji et al. | 427/8 |
| 2002/0182311 | A1 * | 12/2002 | Leonardi et al. | 427/128 |

* cited by examiner

*Primary Examiner*—Fred J. Parker
(74) *Attorney, Agent, or Firm*—F. Chau & Associates, LLC

(57) ABSTRACT

A method for direct writing an electrically conductive metallic feature on an insulating substrate comprises creating a gas jet comprising metallic particles (301), ejecting the gas jet comprising metallic particles through a straight bore tube (302), and impacting the gas jet comprising metallic particles onto a substrate to impinge the metallic particles on the substrate to form the electrically conductive metallic feature (303).

5 Claims, 4 Drawing Sheets

1.5mm w/ ORC 1.5mm w/ TIP 1.5mm

CI w/ TIP

CI ~ 1.6 mm

DIRECT WRITING OF METALLIC CONDUCTOR PATTERNS ON INSULATING SURFACES

The U.S. Government has a paid-up license in this invention and the right in limited circumstances to require the patent owner to license others on reasonable terms as provided for by the terms of grant no. N000140010654, awarded by the Office of Naval Research.

BACKGROUND OF THE INVENTION

1. Field of the Invention

This invention relates to solid-state impingement and consolidation of metallic and polymeric powders and more particularly to low heat, subsonic fine spray deposition of direct write conductors.

2. Discussion of Related Art

There exist several methods for producing conductor traces on insulating substrates in thick-film-based electronic circuits. Approaches include additive fabrication through screen printing of conductive ink-pastes followed by a thermal curing step, direct writing of conductive pastes through micro-dispensing systems, subtractive patterning through photo-lithographic methods from sheet products, laser based methods based on material removal for feature fabrication, and various combinations of these methods. These methods are used to produce thick-film electronic circuits on printed circuit boards, co-fired ceramic multi-chip modules, hybrid microelectronics and related applications in sensor circuits.

Rapid prototyping and manufacturing applications are emerging in the areas of large-substrate ceramic multiple modules, thick-film sensors, and microwave electronics. Application-specific circuit fabrication can require considerable tooling costs and, in general, become uneconomical for low volume manufacturing.

In many applications the substrate or electronic materials cannot be exposed to excessive temperatures, as needed by some traditional sensor fabrication processes, for example, those involved a firing step. The concept of direct write patterning in the mesoscale (feature sizes from 10 μm–10 millimeter) is being considered for rapid prototyping of electronic circuits as well as for fabrication of conformal electronic circuits onto low-temperature substrates. Several examples of such direct write systems and applications can be found in the recently published proceedings of the Materials Research Society (Materials Development for Direct Write Technologies, Ed. Chrisey et at. Vol. 624, 2000) and in a book (Direct Write Technologies for Rapid Prototyping Applications, Ed. Chrisey and Pique, 2002, Academic Press). There are significant advantages to direct write fabrication of metallic circuits through all-additive approaches. These include the ability to rapidly print patterns for circuit prototyping by translating CAD objects to manufactured components; the ability to write on conformal geometries; part-to-part customizability; simple and straightforward design changes; minimizing material waste through focused patterning; and reduced environmental issues through elimination of etching chemicals, solvents, and subtraction-processed waste material. Many present direct write methods however, have the disadvantage that it is necessary to thermally cure the printed paste to achieve the requisite conductivity or other functional properties.

Thermal spray is a directed spray process in which material, generally in molten form, semi-molten, or solid form, is accelerated to high velocities, and then impinges upon a substrate, where a dense and strongly adhered deposit is rapidly built. Material is typically injected in the form of a powder, wire or rod into a high velocity combustion or thermal plasma flame, which imparts thermal and momentum transfer to the particles. By carefully controlling the plume characteristics and material state, it is possible to deposit a vast range of materials (metals, ceramics, polymers and combinations thereof) onto virtually any substrate in various conformal shapes. For metals, the particles can be deposited in solid or semi-solid state. For ceramic deposits, it is generally necessary to bring the particles to well above the melting point, which is achieved by either a combustion flame or a thermal plasma arc. The deposit is built-up by successive impingement of droplets, which yield flattened, solidified platelets, referred to as 'splats'. The deposited microstructure and, thus, properties, aside from being dependent on the spray material, depend strongly on the processing parameters, which can be numerous and complex.

Cold Spray Deposition and related solid state kinetic energy processes are a new family of spray devices (not strictly "thermal spray") (Gas dynamic principles of cold spray, R. C. Dykhuizen and M. F. Smith, Journal of Thermal Spray Technology, vol. 7(2) (1998) 205, Kinetic spray coatings, T. H. Van Steenkiste et al, Surface and Coatings Technology, Vol. 111 (1999) 62–71). These systems, through special convergent-divergent nozzles use continuous gas pressure to accelerate a variety of materials to supersonic velocities to impact onto metallic and ceramic substrates where an unusually high adhesive bond is achieved. This unique process can produce a fully dense (minimal porosity) deposit, for example, of copper and silver, leading to a high level of electrical conductivity.

One of the described cold spray methods is a process entitled "Cold Gas Dynamic Spraying" or Kinetic Spraying. U.S. Pat. No. 5,302,414 by Alkhimov et at. describes a gas dynamic method for spray deposition of materials wherein particles of metals, plastics and mixtures of metals and ceramics in the size range of 1–50 microns are injected into a supersonic gas stream at particle velocities greater than 300 m/s and less than 1200 m/s so as to produce a deposit. U.S. Pat. No. 6,139,913 by Van Steenkiste et al. discusses an improvement to the Alkhimov patent to enable deposition of larger particles, in excess of 50 microns, by substantially increasing the supersonic gas velocities so as to accelerate these large particles to velocities of 300–1200 m/s. U.S. Pat. No. 5,795,626 and improvement U.S. Pat. No. 6,074,135 describe a mixing and conveying method based on a supersonic applicator that purports to produce tribo-electrically charged particles subsequently depositing the particles while recovering said excess material and gas. The Alkhimov and Van Steenkiste patents and subsequent technical publications based on these processes (as mentioned above by Dykhuizen et al. and Van Steenkiste et al.) indicate that when the particle velocity reaches a critical velocity the particles form a deposit with sufficient transfer efficiency to be useful. The critical velocities can vary depending on the material to be deposited. All of the above methods provide for a converging-diverging 'de Laval' type nozzle to create the supersonic gas jets and therefore the high particle velocities. These patents also teach a gas heater arrangement to enable high supersonic velocities in a variety of gases. Both Alkhimov and Van Steenkiste do not discuss direct write methods and teach away from the use of straight bore tubes and sub-sonic approaches.

There are a number of disadvantages in utilizing the methods described in the above patents for depositing very fine direct-written material patterns needed for electronics and sensor applications. These include the inability to produce high quality convergent-divergent nozzles in the sub-millimeter diameter size regime for generating the supersonic jets, especially near the 100–500 micron regime. Boundary layer effects and the reduced mean free path of the particles within a small nozzle can substantially reduce both gas and particle velocities making it difficult or impossible to achieve the requisite critical velocity for material deposition as discussed above. Furthermore, in order to deposit materials through very fine nozzles, the particle size must be significantly smaller than that used for traditional-sized nozzles. This can lead to clogging of the nozzle within the convergent location resulting in non-uniform deposition, spitting, and erratic deposition performance. In addition, fine particles in a supersonic jet tend to accelerate to very high velocities and can experience "bow-shock" at the location of impact, and therefore, be carried with the gas stream, rather than be deposited onto the substrate. An additional disadvantage of the high-pressure supersonic system is the need for complicated high-pressure equipment and the production of sustained high noise levels, which must be adequately attenuated to avoid ear damage.

Another disadvantage of high-velocity supersonic jets is that they are not suited for deposition on "soft" substrates, including polymers, plastics, paper products, textiles, biological materials, and foods. The kinetic energy of the particles deposited using supersonic jets is considerable, as the kinetic energy scales as the square of the velocity. At supersonic velocities, the particles are sufficiently energetic to perforate and/or rupture soft or pliable surfaces. As such, significant obstacles are present with supersonic deposition on soft substrates.

Therefore, a need exists for a method for low heat, subsonic fine spray deposition of direct write conductors onto a variety of substrates.

SUMMARY OF THE INVENTION

The present invention discloses a method and apparatus for subsonic solid-state deposition of finely powdered or finely flaked metal particles for applications as direct write conductors. The concept can also be expanded to deposit patterns as well as the possible deposition of polymeric materials. The present invention utilizes a very fine straight bore tube in which a sub-sonic jet is created, with a diameter ranging from 25 microns (0.001 in.) to 1 millimeter (0.040 in). Premixed powder and helium or other gases at room temperature are injected into the straight bore subsonic nozzle and directed at the substrates under these subsonic conditions, resulting in a material deposit that is built-up in layers. High-quality conductor traces in the 50 micron to 1 millimeter range can be achieved using certain types of materials (e.g. silver flake). Due to the relatively low exit velocity of the particles in the sub-sonic jet compared to a supersonic jet, the conductor traces can be prepared on soft materials such as polymer, textile and paper products.

The process thus identified is entitled Subsonic Solid-State Deposition, also referred to $S^4D$.

According to an embodiment of the present invention, a method for direct writing an electrically conductive metallic feature on an insulating substrate comprises creating a gas jet comprising metallic particles, ejecting the gas jet comprising metallic particles through a straight bore tube, and impacting the gas jet comprising metallic particles onto a substrate to impinge the metallic particles on the substrate to form the electrically conductive metallic feature.

The method comprises operating the gas jet comprising metallic particles in a subsonic flow regime.

According to an embodiment of the present invention, a method for direct writing of a metallic conductor feature onto an insulating substrate comprises producing a mixture of a metal powder and a gas, accelerating the mixture in a subsonic carrier gas jet through a straight-bore tube, directing the subsonic carrier gas jet onto the substrate, and manipulating one of the subsonic carrier gas jet and the substrate in a predetermined pattern for forming the metallic conductor feature.

The method further comprises providing a binding agent, wherein the binding agent coats the metal powder. The binding agent is an anti-agglomeration agent coating.

Manipulating one of the subsonic carrier gas jet and the substrate in a predetermined pattern comprises providing a motion-capable device under computer control.

The method comprises passing an electrical current through the metallic conductor feature to improve the electrical conductivity of the conductor.

A length of the straight-bore tube is substantially less than a length needed for sonic flow to occur in the deposition tube.

According to an embodiment of the present invention, a system for direct writing a metallic conductor feature onto a substrate comprises a means for providing a metallic material, a means for providing an accelerant, a means for mixing the metallic material and accelerant, and a straight bore tube for receiving a mixture of metallic material and accelerant and depositing a portion of the mixture of metallic material and accelerant onto a substrate.

A diameter of the straight bore tube is in the range of about 25 micrometers to 1 millimeter.

The accelerant is gas comprising at least one of Helium, Argon, Air, Hydrogen, and Nitrogen.

The metallic material has a flake morphology. The metallic material comprises at least one of silver, zinc, copper, gold, aluminum, indium, lead, and tin. The metallic material is coated with an anti-agglomeration agent.

The substrate is a ceramic. The substrate is a polymeric material. The substrate is flexible. The substrate is one of a polymer textile, a paper product, a food stuff, and a biological material.

The straight bore tube is directed by a motion-capable device under computer control. The straight bore tube has a length less than the length needed for sonic flow to occur in the deposition tube. A length/diameter ratio of the straight bore tube is about 25 or greater. A distance between an exit of the straight bore tube and the substrate is less than 1 millimeter. The straight bore tube is substantially normal to the substrate. The straight bore tube is off-normal to the substrate.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

According to an embodiment of the present invention, a feature conductor trace or pattern can be formed for functional components in mesoscale (e.g., about 10 microns to millimeter length scales) electronics and sensor applications. These features can have complex conformal geometries on surfaces including, for example, ceramics, brick and cements, wood, paper and textiles. Furthermore when using appropriate substrates, the features can survive in harsh environments such as liquid immersion, high temperatures, and erosion.

The feature conductor traces and patterns can be formed of conductive metallic lines, spots, areas, and vias (e.g., filled holes). Thus, the features can be formed for conductive traces for thick-film meso-scale electronic circuitry and sensors. According to an embodiment of the present invention, the beneficial attributes of thermal spray and technologies such as solid state deposition can be combined so as to produce dense deposits on a variety of surfaces that can perform an electrical conductivity function without the need for post spray sintering or annealing treatment, which are needed for many thick-film paste based approaches. Additionally, the substantially instant curing capability of impacted deposits allows for the entire process to operate at low temperatures, e.g., less than about 200° C., thereby minimizing thermal mismatch stresses.

According to an embodiment of the invention fine features can be achieved in an as deposited state that can reduce the need for masking or material removal methods. Straight-bore nozzles can be implemented having fine dimensions.

Figure 1B:
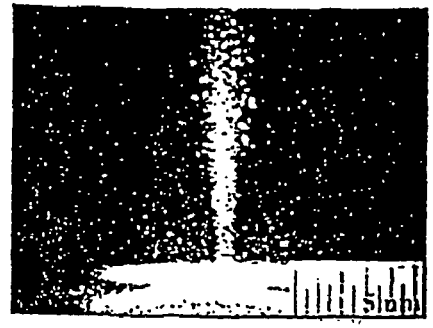
FIG. 1b–1e are images of various spray streams according to an embodiment of the present invention.
Figure 1C:
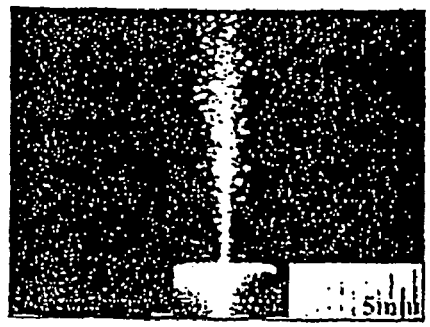
Figure 1A:
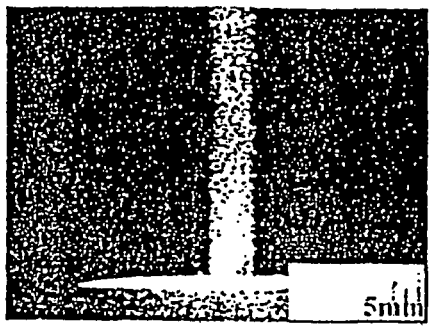
FIG. 1a is an image of a supersonic spray stream from a converging-diverging nozzle.
Figure 1D:
Figure 1E:
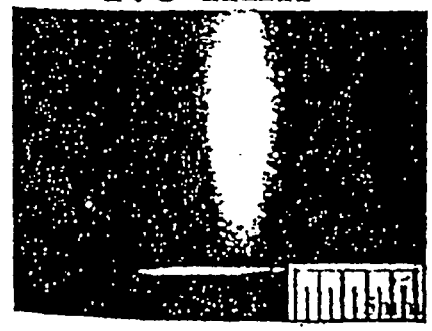

The results obtained with the fine straight-bore nozzles are unexpected because of the gas flow properties associated with straight-bore nozzles. These properties include the following: long straight bore tubes do not provide the supersonic acceleration afforded by the converging-diverging nozzles; in fine tubes, the boundary layer effects can become significant and can slow the gas velocity down substantially thereby reducing the imparted particle velocities; and the divergence in the gas stream occurring at some distance from the exit nozzle tip, which is related to the nature of the gas flow through a straight tube. FIG. 1a shows a supersonic gas stream from a converging-diverging tube whereas FIGS. 1b to 1e show a subsonic gas stream from a straight-bore tube according to an embodiment of the present invention. According to an embodiment of the present invention, materials can be reliably feed through fine tubes, wherein the materials are deposited on a substrate.

Figure 2:
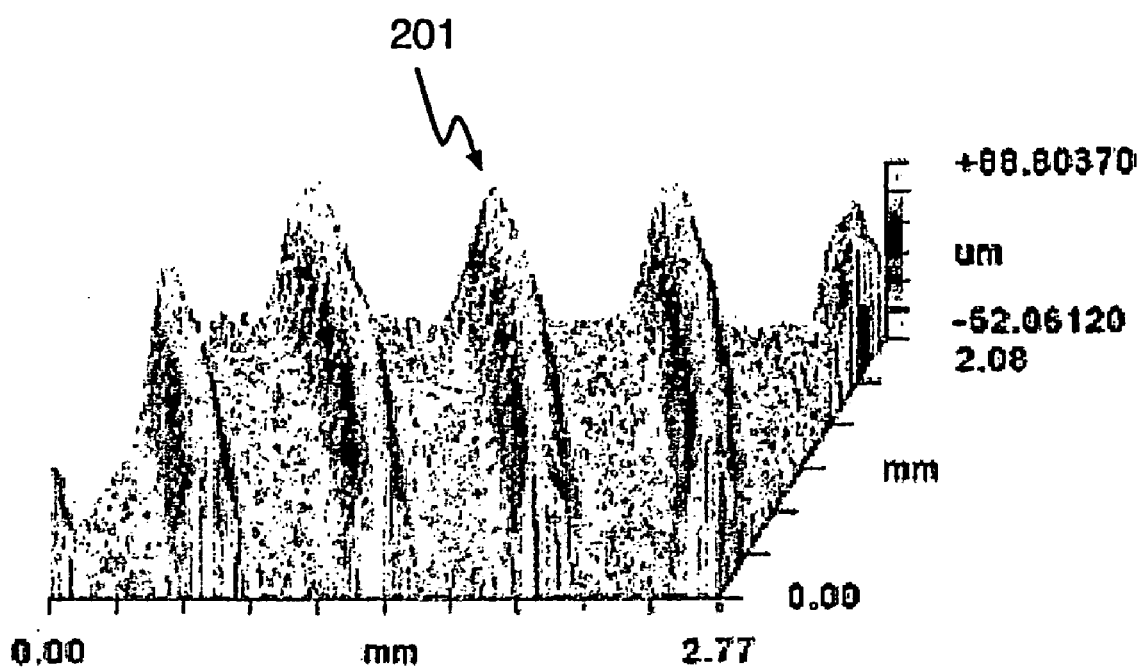
FIG. 2 is a Zygo plot of a deposit profile according to an embodiment of the present invention.

The issue of gas stream divergence at the tube exit can be addressed by reducing the tip-to-substrate distance. As shown in FIGS. 1b to 1e the gas stream divergence increases as the distance from the exit is increased. By placing a substrate within a few nozzle diameters of the nozzle, a desirable deposit profile can be obtained. FIG. 2 shows a deposit profile in which individual conductor lines, e.g., 201, can clearly be seen. The ability to produce deposits at sub-sonic impact can be accomplished by selection of process conditions, materials characteristics, and robotic manipulation. For example, flake powder morphology is superior to other powder morphologies. Irregular morphology, such as that of flake powder, allows for rapid particle acceleration. Selecting materials with high ductility, such as silver, can enhance the rate of deposition. Further, incorporation of polymeric films on the surfaces of the powders can enable improved compaction during the deposition process.

According to an embodiment of the present invention, desirable deposition can be achieved by mixing silver powder and helium at pressures of less than about 500 pounds per square inch gauge (psig), with a preferred range between 100–350 psig, and a temperature between ambient, about 20° C., and about 200° C., and ejecting the mixture through a straight bore nozzle to a substrate to be coated. The straight bore nozzle can have a diameter in the range of about 25 microns (0.001 in.) to about 1,000 microns (0.040 in.) and a length to diameter ratio of about 100. The substrate can be located at a variety of distances from the tube exit; however, as the tube exit velocity is subsonic, the particle stream will diverge with increasing distance from the tube exit. As such, smaller features can be obtained when the substrate is maintained within a few diameters of the substrate relative to the diameter of the tube. Further, silver powder in flake form can be implemented as the conductor material. The preferred size of the particles ranges from about 1 to 5 microns.

The angle of incidence between the centerline of the straight bore nozzle and the substrate can be about 90 degrees but can be smaller. The nozzle can be manipulated by a robotic arm for conformal surfaces or the nozzle can be kept on a stationary z-axis while the substrate can be moved using x-y translation stage.

According to an embodiment of the present invention, the deposit material, e.g., flake silver, is coated with a polymer coating to reduce agglomeration of the powder, which in turn can also act as a binder during solid state impingement. Further the deposition process can include the passing of an electric current through the freshly deposited conductor line to burn off this polymer binder/surfactant to increase the electrical conductivity of the conductor. This can be repeated one or more times. This current produces resistive (Joule) $I^2R$ heating that increases the temperature of the conductor for said burnoff.

Analytical modeling was utilized to verify the flow state of the gas within and at the exit of the tube. The flow analysis assumed the following: steady state 1-D flow; ideal gas with constant specific heats; constant area duct; negligible shaft work and potential energy changes; wall shear stress correlated by a Darcy friction factor; flow is adiabatic; and smooth tube walls.

It can be shown that adiabatic frictional flows in ducts with constant cross section approach the sonic limit (Ma=1) with increasing duct length. Ma=u/a is the Mach number, where u is the flow velocity and a the speed of sound. This is true for both subsonic and supersonic flows, hence if a flow is subsonic at some point in a duct of constant cross section, then it will remain subsonic, or at most, become sonic (Ma=1) at some point in the duct. The transition from sub-sonic flow to supersonic flow, or vice versa, is prevented by entropy constraints.

For subsonic adiabatic flow (Ma<1) with prescribed conditions including pressure, temperature, duct geometry, type of gas, friction factor, and initial Mach number at the duct inlet, the length of duct needed for the flow to become sonic, L*, can be expressed as:

$$L^* = \frac{D}{\bar{f}} \cdot \left[ \frac{1-Ma^2}{\gamma Ma^2} + \frac{\gamma+1}{2\gamma} \ln \frac{(\gamma+1)Ma^2}{2+(\gamma-1)Ma^2} \right] \quad (1)$$

Here D is the diameter (for circular ducts; otherwise it is the hydraulic diameter), $\bar{f}$ is the average friction factor along the duct, and γ is the ratio of specific heats for the gas.

A series of experiments using parameters associated with the deposition process discussed earlier were performed to characterize the flow in the tubes as well as verify that the duct flow is subsonic. The mass flow of helium gas through circular tubes with a diameter, D, of 500 μm (0.020 in.), 250 μm (0.010 in.) and 125 μm (0.005 in.) and length, L, of 25 millimeter (1 in.) and 50 millimeter (2 in.) were tested. The flow rates for all six combinations of tube diameter and length were found to highly linearly correlated to the inlet pressure, with no deviation or abrupt flow rate change observed in any cases.

The helium gas absolute pressures at the tube entrance ranged from 50 psig to 300 psig. The gas discharged from the tube into the ambient at a pressure of 15 pounds per square inch absolute (psia) (1 ATM). The inlet and ambient gas temperatures were 300° K. The inlet pressure and gas volumetric flow rate was measured using industry-standard instruments. As expected, the largest flow rates were observed with the largest diameter tubing, e.g., 500 μm, at the highest gas pressure, e.g., 300 psig. Since longer tubes result in higher Mach numbers, the 500 μm tube at 300 psig and 50 millimeter length represents the tube with the highest Mach number. The following analysis is used to verify that the flow in the tube remains subsonic throughout the tube length.

To determine the inlet Mach number, the following calculations are performed for a tube with 500 μm diameter and 50 millimeter length:

| | |
|---|---|
| R = 2076 m²/s².K | gas constant for He |
| T = 300 K | temperature of gas at tube entrance |
| γ = 1.66 | ratio of specific heats for He |
| μ = 1.97 × 10⁻⁵ N s/m² | viscosity of He |
| a = (γRT)^½ = 1017 m/s | speed of sound at inlet conditions |
| Q = 1.38 liter/s | volumetric flow rate of He through tube (at SIT) |
| $\rho_0$ = P/RT = 2.38 kg/m³ | gas density at STP |
| A = πD²/4 = 2.03 × 10⁻⁷ m² | tube cross sectional area |
| $\dot{m}$ = $\rho_0$Q = 0.23 gm/s | mass flow rate through tube |
| $u_0$ = $\dot{m}$/$\rho_0$A = 323 m/s | radially averaged velocity at tube inlet |
| $Ma_0$ = $u_0$/a = 0.32 | Mach number at tube inlet |

As can be seen, $Ma_0$=0.32 and the flow is clearly subsonic at the tube entrance. As the flow moves down the tube, the pressure decreases and the gas expands, resulting in an increased flow velocity and a correspondingly higher Mach number. Using Eq. (1), the length of the tube L*, needed for the flow to reach the sonic limit is 79 millimeter (3.1 in.). Here an average friction factor $\bar{f}$=0.023 was obtained from the Moody charts for a smooth-walled tube with a Reynolds number $\rho_0 u_0 D/\mu$=2.9×10⁴ for the determination. As can be seen the length of the tube needed for the flow to become sonic is well over 50% greater than the longest tube (50 millimeter) used in this work, and thus it can be seen that the flow is subsonic throughout the entire tube, e.g., no transition to supersonic flow occurs.

There are no solid particles in the flow tests discussed above, as there are during actual device operation, however the presence of particles would only tend to reduce the velocity, thus resulting in lower Mach members, and a longer critical length, L*, needed for the flow to teach the sonic limit. The analysis also neglects entrance region effects at the tube inlet, but since the tube aspect ratio, L/D~100, and entrance region effects are typically confined to a distance of only several diameters into the tube, entrance region effects can be neglected without substantially altering the outcome of the above.

Figure 3:
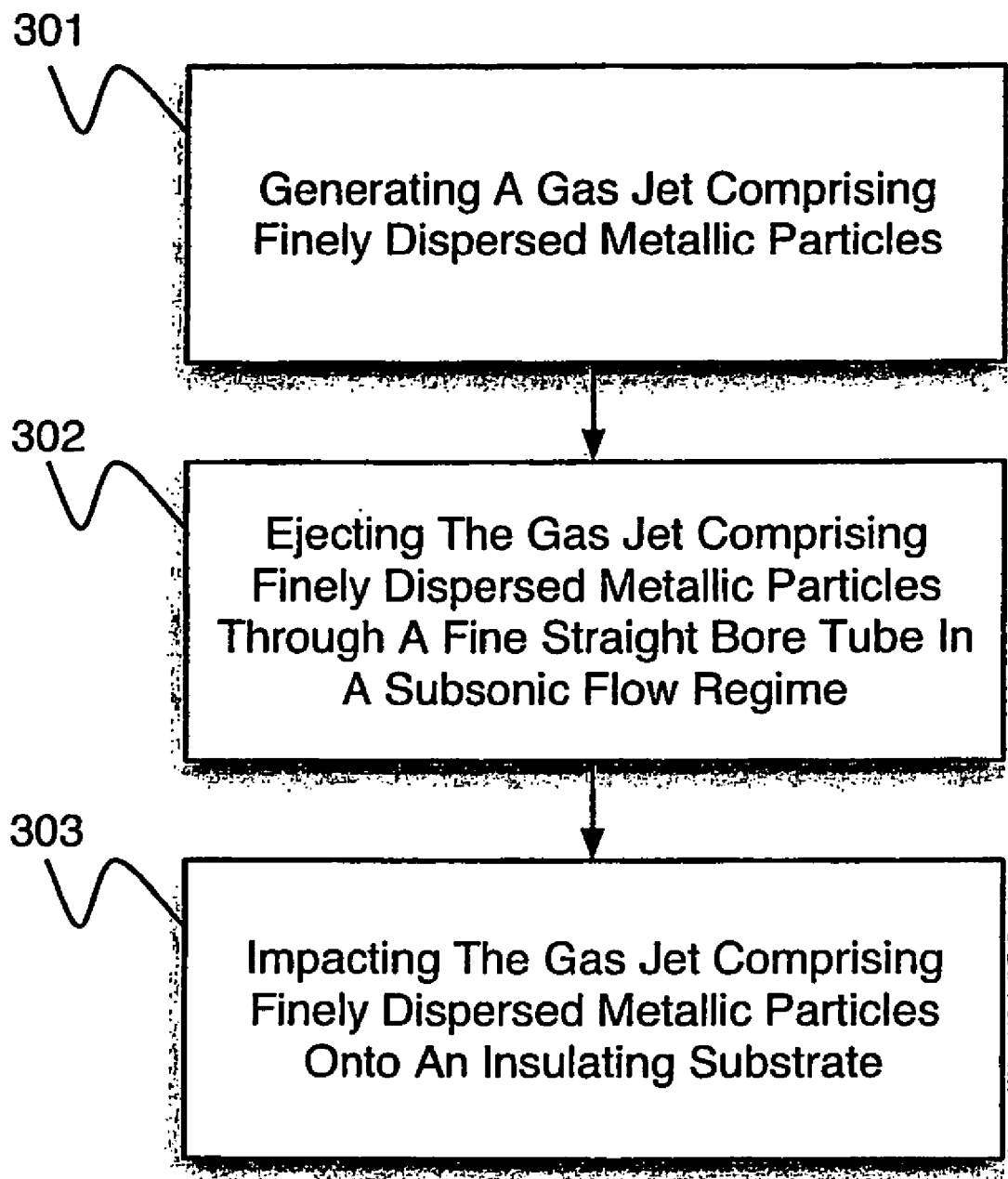
FIG. 3 is a flow chart of a method according to an embodiment of the present invention.

Referring to FIG. 3, a method for direct writing of fine conducive metallic lines, spots, areas, and vias comprises creating a gas jet comprising finely dispersed metallic particles obtained by fluidizing the particles in a feeder 301 and ejecting a gas jet through a fine straight bore tube with the gas jet operating in a subsonic flow regime 302. The gas-particle mixture can be impacted onto a insulating substrate 303. The substrate can be, for example, a ceramic, polymer, paper, and/or textile. The gas jet can be created from, for example, helium (He), argon (Ar), air, hydrogen (H2), and mixtures of these and other gases. The straight bore tube can have a diameter between about 25 microns and about 1000 microns. The length to diameter ratio of the straight bore tube can be about 100. The powdered metal can be a silver (Ag), wherein the silver powder morphology is flake. The flake silver powder has a polymer film on the surface. The gas is helium at pressures of 50 to 300 psig and temperature between 25° C. (room temperature) and 200° C. The tube can be inclined as well as normal to the substrate.

Figure 4:
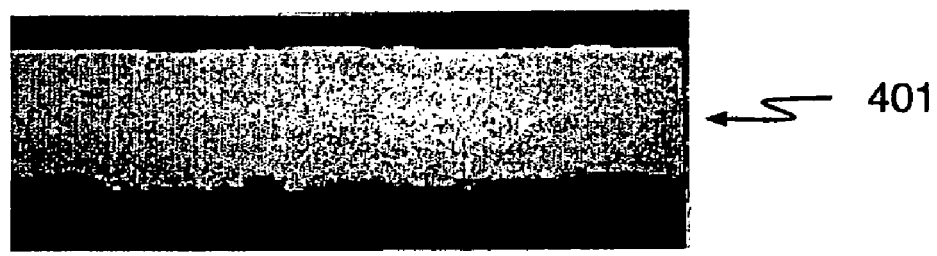
FIG. 4 is an image of a straight bore tube, subsonic, solid state deposited silver according to an embodiment of the present invention.

FIG. 4 shows the microstructure of a S⁴D deposited silver line 401. The deposits can be characterized by their high density and fine cross-section.

Figure 5:
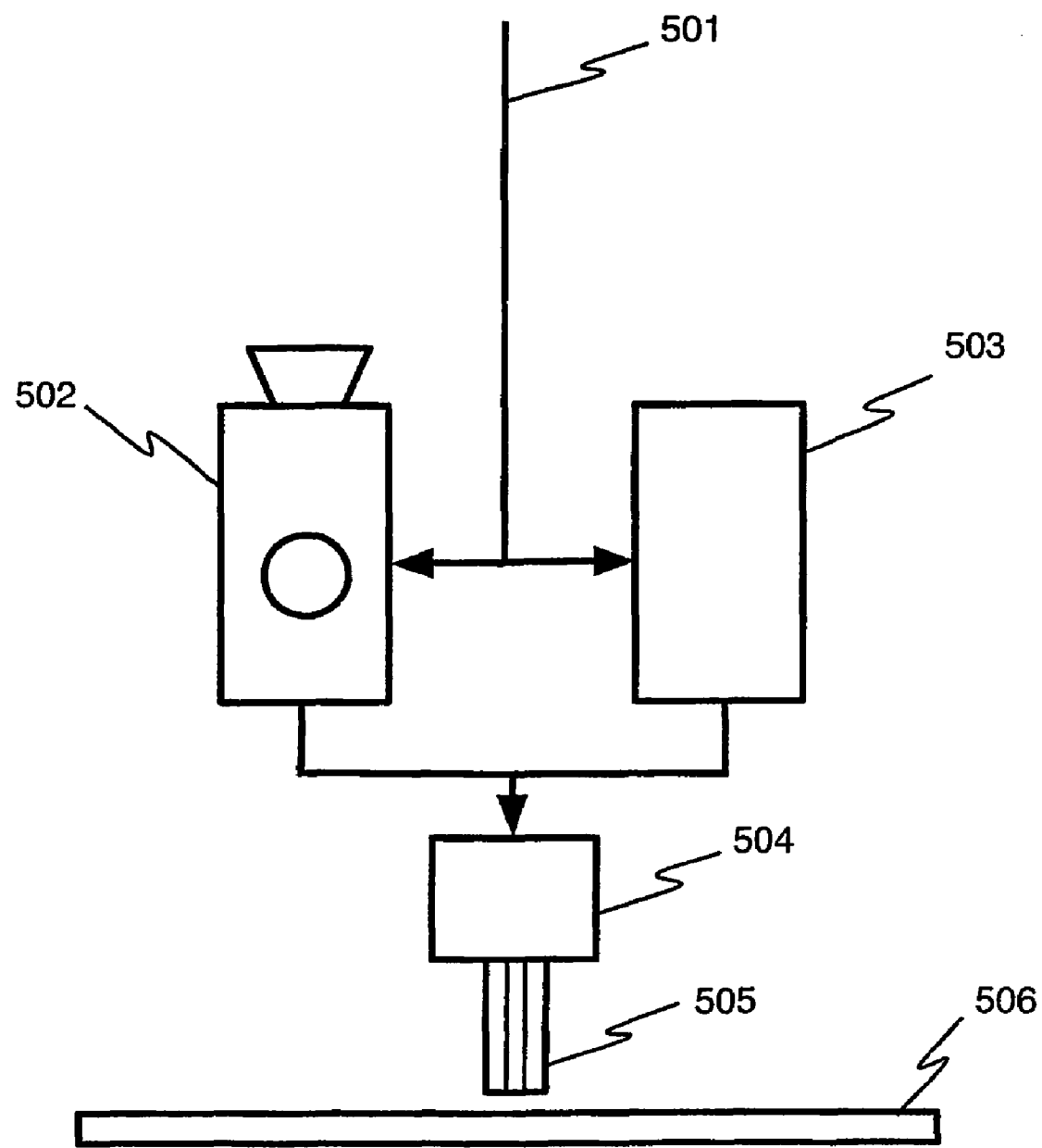
FIG. 5 is a diagram of a system according to an embodiment of the present invention.

Referring to FIG. 5, a gas line 501 provides pressurized gas to a material feeder 502 and an accelerant supply 503. The accelerant supply 503 provides an accelerant such as Helium, Argon, Air, Hydrogen, and Nitrogen. The material from the feeder 502 and the accelerant from the heater 503 are combined in at a mixing head 504 comprising a straight bore tube 505. The material is ejected from the straight bore tube at a subsonic jet and is deposited on a substrate 506. The mixing head 504 and straight bore tube 505 can be connected to a programmable robotic arm. Similarly, the substrate can be positioned on a programmable stage. Thus, the substrate and or straight bore tube can be move in relation to one another to produce a feature such as a line.

According to an embodiment of the present invention, the spray based direct writing of conductor traces and patterns can offer significant advantages including: high throughput manufacturing as well as high speed direct writing capability; in situ application of metals and polymers or combinations of these materials, without thermal treatment or curing; incorporation of mixed or graded layers; useful materials properties in the as-deposited state; and being cost effective and efficient while having the ability to process in virtually any environment. The advantages further include: limited thermal input during processing, allowing for deposition on a variety of substrates; adaptability to flexible manufacturing concepts, e.g., lean manufacturing; and robotics-capable for difficult-to-access and severe environments, e.g., the method and system are portable. Further still the advantages include: readily available for customizing special sensor systems (i.e., prototyping); green technology vise-vis plating, lithography, etc.; can be applied on wide range of substrates and conformal shapes; high aspect ratio conductors and capability for via production; rapidly translatable development to manufacturing using existing infrastructure; and site applicability using portable tools.

Having described embodiments for direct writing of metallic conductor features, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method for direct writing of a metallic conductor feature onto an insulating substrate comprising:
   producing a mixture of a metal powder having a flake morphology and a gas;
   accelerating the mixture in a subsonic carrier gas jet through a straight-bore tube;
   directing the subsonic carrier gas jet onto the substrate; and
   manipulating one of the subsonic carrier gas jet and the substrate in a predetermined pattern for forming the metallic conductor feature wherein the formation of the metallic conductor feature occurs at temperatures less than about 200 degrees Celsius.

2. The method of claim 1, further comprising providing a binding agent, wherein the binding agent coats the metal powder.

3. The method of claim 2, wherein the binding agent is an anti-agglomeration agent coating.

4. The method of claim 1, wherein manipulating one of the subsonic carrier gas jet and the substrate in a predetermined pattern comprises providing a motion-capable device under computer control.

5. The method of claim 1, wherein a length of the straight-bore tube is substantially less than a length needed for sonic flow to occur in the straight-bore tube.

\* \* \* \* \*